July 19, 1966 L. A. HARWOOD ET AL 3,261,981

PARAMETRIC AMPLIFIER FREQUENCY UP-CONVERTER

Filed May 11, 1962 2 Sheets-Sheet 1

INVENTORS
LEOPOLD A. HARWOOD &
TOMOMI MURAKAMI

BY Eugene M. Whitacre
ATTORNEY

PARAMETRIC AMPLIFIER FREQUENCY UP-CONVERTER

Filed May 11, 1962

INVENTORS
LEOPOLD A. HARWOOD &
TOMOMI MURAKAMI
BY Eugene M. Whitacre
Attorney

3,261,981
PARAMETRIC AMPLIFIER FREQUENCY UP-CONVERTER

Leopold A. Harwood and Tomomi Murakami, Haddonfield, N.J., assignors to Radio Corporation of America, a corporation of Delaware Filed May 11, 1962, Ser. No. 193,935
6 Claims. (Cl. 307—88.3)

This invention relates to frequency converters and more particularly relates to frequency converters which utilize a variable reactance device as the active element thereof.

Frequency converters, which utilizes a nonlinear variable reactance device as the mixing element thereof, have been termed parametric converters. In its simplest form, a parametric converter comprises a nonlinear variable reactance device to which are coupled a source of signals and a pump oscillator by means of their associated resonant circuits, tuned respectively to the frequency of an input signal to be converted and the frequency of a pump oscillator signal. Additionally, at least one other resonant circuit, the idler circuit, is coupled to the nonlinear variable reactance device to derive output idler signal having a frequency corresponding to one of the side bands produced by the interaction of the input signal and the pump oscillator signal in the nonlinear reactance device.

When the idler circuit is tuned to the difference between the frequencies of the input and pump oscillator signals, the parametric converter is said to operate in the difference mode, whereas when tuned to the sum of these frequencies, the parametric converter operates in the sum mode. If the frequency of the idler output signal is greater than the frequency of the input signal, the parametric converter functions as an up-converter, whereas if the idler output signal frequency is less than the input signal frequency, the parametric converter functions as a down-converter.

Conversion gain, i.e. signal amplification as well as signal frequency conversion, and low noise operation may be achieved in a parametric converter. The conditions for conversion gain have been set forth in an article by J. M. Manley and H. E. Rowe in the July 1956 issue of the Proceedings of I.R.E. In this article, it is specified that, when two signals of different frequencies are applied to a nonlinear variable reactance device, more power is supplied to the variable reactance device, and hence to the mixed output signal, by the signal at the higher frequency than by the signal at the lower frequency. Thus, parametric converters are operated with a pump oscillator signal at a frequency higher than the frequency of an input signal in order to provide an idler output signal exhibiting conversion gain.

Since signal currents of different frequencies, namely the frequencies of the input and the pump oscillator signals, and the sum and difference frequencies thereof, flow through the nonlinear reactance device, this device functions as a common coupling element between the various resonant circuits. Such coupling between the various resonant circuits presents serious problems in a parametric converter which is made tunable over a band of frequencies. If the resonant circuits are not decoupled from each other, the tuning of one of the resonant circuits detunes the other resonant circuits which, when retuned, in turn detune the first resonant circuit.

Another problem in parametric converters is that of achieving high conversion gain with stable operation. When a parametric converter is operated in the sum mode, the maximum available gain is a function of the ratio of the frequency of the idler output signal to the frequency of the input signal. Accordingly high pump oscillator signal frequencies, relative to input signal frequencies, are utilized. While the sum mode operation is stable, it is difficult to achieve high conversion gain if the input signal frequency is high, such as in the UHF television range, because of the upper frequency limitations of available high frequency oscillators.

When a parametric frequency converter is operated in the difference mode, the conversion gain achieved may be exceedingly high inasmuch as the variable rectance device exhibits an effective negative resistance and the operation is regenerative. However, difference mode operation tends to be unstable. If the input circuit impedance is not carefully controlled, the effective negative resistance exhibited by the variable reactance device may cause spurious oscillations to occur. Since the input circuit impedance in signal wave receivers is usually the antenna circuit impedance, which is subject to uncontrolled changes due to environmental and man-made conditions, isolating devices are commonly inserted between the antenna circuit and the difference mode parametric frequency converter. However, available isolating devices are not only bulky and expensive but are also impractical for parametric frequency converters which are tunable over a wide band of frequencies, because of the relatively narrow bandwidth over which available isolating devices function effectively.

Thus in difference mode operation exceedingly high conversion gains are possible but with an accompanying instability problem; while in sum mode operation, substantially no instability problem is present but the conversion gain is limited by the available pump oscillator signal frequency.

Accordingly, it is an object of this invention to provide a parametric frequency converter which exhibits high conversion gains while being stable in operation.

It is another object of this invention to provide a parametric frequency converter which exhibits high conversion gain, is stable in operation and is compact in construction.

It is still another object of this invention to provide a parametric frequency converter which exhibits high conversion gains, is stable in operation, and is tunable over a band of high frequencies.

It is a further object of this invention to provide a parametric frequency converter in which the conversion gain may be selectively controlled.

In accordance with the invention a parametric frequency converter comprises a conductive chassis compartment having T-shaped cross-section and including a cross-arm section and a leg section. A first conductive partition is mounted within and transversely across said cross-arm section to separate said cross-arm section into a first cavity resonator, resonant at the frequency $f_p$ of a pump oscillator; and a second cavity resonator, resonant at the frequency $f_o$ of a sum mode idler output signal. A second conductive partition is mounted within said compartment at the junction of said cross-arm and leg sections to transform said leg section into a third cavity resonator, resonant at the frequency $f_i$ of a difference mode idler signal. An opening, or iris is provided at the junction of the two partitions to provide common coupling between the three cavities.

A nonlinear device, such as a variable capacitance diode, is mounted within said compartment in the space formed by the iris so as to be coupled to all three cavity resonators. The variable capacitance diode is mounted with one electrode thereof directly connected to the top of said chassis compartment while the other electrode thereof is coupled to the bottom of said compartment through the parallel combination of a capacitor, and a radial transmission line which functions as a filter for difference mode idler signals at the frequency $f_i$. The radial transmission line filter effectively prevents the development of difference mode idler signals across the capacitor. The exact manner of mounting the nonlinear device will be described more fully subsequently.

Input signals of a frequency $f_s$ are coupled across the capacitor, which exhibits a substantial reactance at input signal frequencies, to apply input signals to said nonlinear device. A pump oscillator, tuned to a frequency $f_p$ higher than the input signal frequency $f_s$, is coupled to said first cavity resonator to apply oscillatory signals to said nonlinear device. Sum and difference frequency idler signals produced by the interaction of said input and pump oscillator signals are developed in the second and third cavity resonators respectively and sum mode idler output signals are coupled from the second cavity resonator for further processing.

Tuning means are provided in all three cavity resonators and the tuning means in the third or difference mode idler signal cavity resonator controls the amount of regeneration, and hence the conversion gain, exhibited by the parametric converter. The further the third cavity resonator is detuned from the difference mode idler signal frequency $f_i$, the more the difference mode idler signals are suppressed and the less the parametric converter exhibits regeneration.

The novel features that are considered to be characteristic of this invention are set forth with particularity in the appended claims. The invention itself, however, both as to its organization and method of operation as well as additional objects and advantages thereof will best be understood from the following description when read in conjunction with the accompanying drawing in which:

Figure 1:
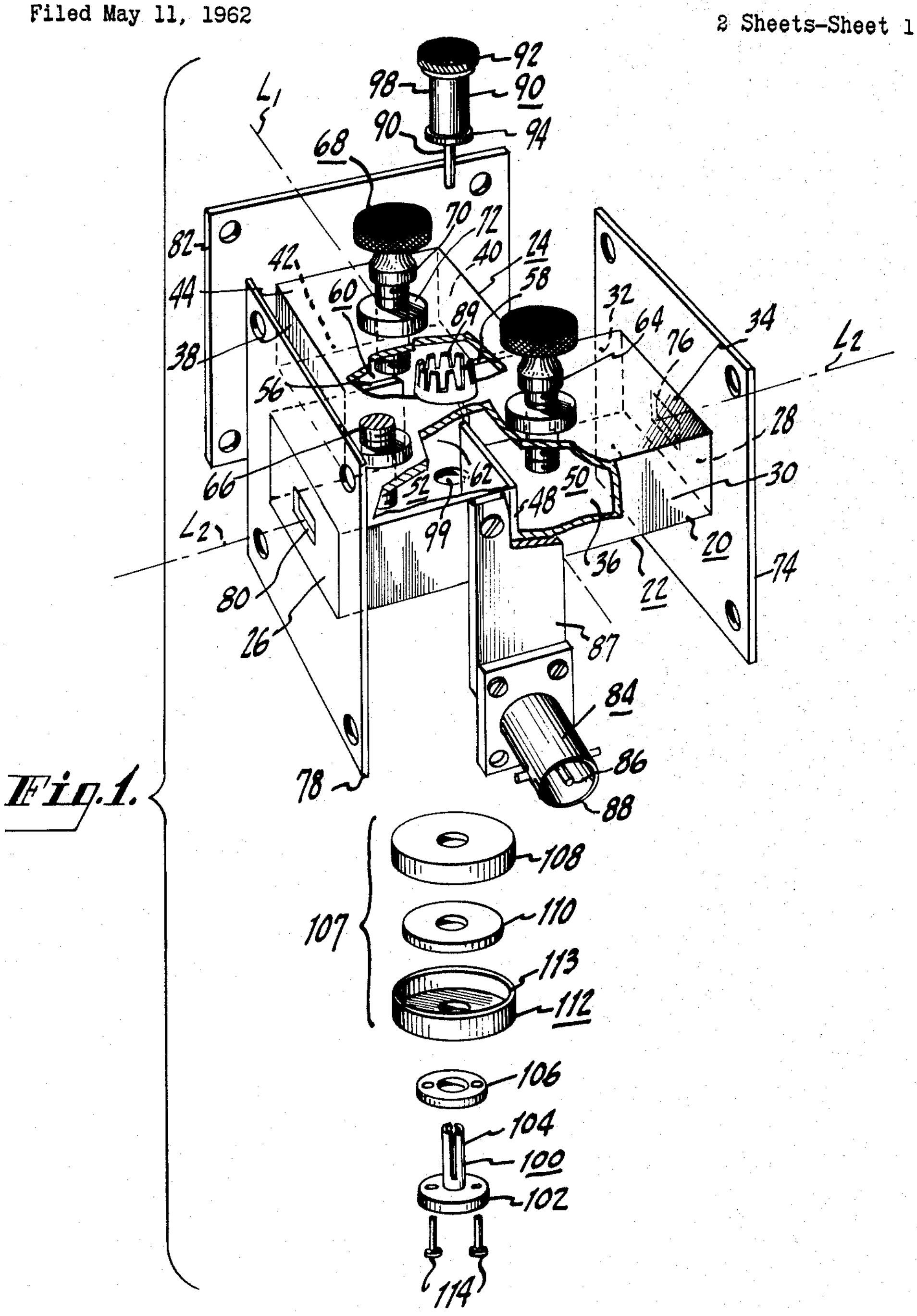
FIGURE 1 is a partially broken, partially exploded, and enlarged perspective view of a parametric frequency converter in accordance with the invention.

Referring now to FIGURE 1, which is drawn enlarged for clarity, a frequency converter in accordance with the invention includes a T-junction chassis compartment 20 having a T-shaped cross-section with a cross-arm section 22 and a leg section 24. The compartment 20 is formed of a conductive material, such as brass waveguide material. The cross-arm section 22 includes endwalls 26 and 28, sidewalls 30 and 32 as well as a top 34, and a bottom 36. The leg section 24 also includes a pair of sidewalls 38 and 40, an endwall 42, as well as a top 44, and a bottom 46. The cross-arm and leg sections of the compartment 20 are formed such that the center axis line $L_1$ of the leg section 24 is in the same plane as, and substantially perpendicular to, the center axis line $L_2$ of the cross-arm section 22. Therefore, since the sidewalls in both sections are equal in height, the tops and the bottoms of the cross-arm and the leg sections are contiguous respectively with each other.

A septum or partition wall 48, also made of a conductive material, is soldered within the cross-arm section 22, parallel to the endwalls 26 and 28 thereof, and extending from the top 34 to the bottom 36, to separate the cross-arm section 22 into a first cavity resonator 50 and a second cavity resonator 52. The partition 48 is mounted to abut the sidewall 30, but does not extend completely across the cross-arm section.

A second septum or partition wall, which includes a pair of conductive members or fins 56 and 58, is mounted within the compartment 20 at the junction of the cross-arm 22 and leg sections 24 and parallel to the endwall 42 of the leg section 24. The conductive members 56 and 58 may of course merely be extensions of the sidewall 32 of the cross-arm section 22, or alternatively an endwall for the leg section 24, with a slot cut therethrough. The conductive members 56 and 58 effectively transform the leg section 24 into a third cavity resonator 60. The conductive members 56 and 58 and the partition wall 48 define an iris 62 at the junction of the leg and cross-arm sections of the compartment 20.

All three cavity resonators 50, 52 and 60 are provided with tuning means 64, 66 and 68, respectively. The tuning means 68 includes a threaded tuning screw 70, made of a conductive material, which extends into the cavity resonator 60 through an opening at the geometrical center of the top of this resonator. The tuning screw 70 is supported by a nut 72 mounted in this opening. The tuning means 64, and 66 (shown broken), for the cavity resonators 50 and 52 respectively are identical in construction and mounting to the tuning means 68.

A waveguide flange 74 is soldered to the endwall 28 of the cavity resonator 50. The flange 74 is formed with an opening, through which the endwall 28 fits, so that the endwall 28 and the flange 74 are flush mounted with respect to each other. An aperture, or iris, 76 is centrally formed on the endwall 28 to provide microwave coupling to the cavity resonator 50.

A waveguide flange 78 is mounted on the endwall 26 of the cavity resonator 52 and an iris 80 is cut through the endwall 26 in a manner identical to the flange 74 and iris 76 of the cavity resonator 50. Similarly, the cavity resonator 60 includes a waveguide flange 82 and may also include an iris (not shown) in the endwall 42 thereof.

A coaxial connector 84 having an inner conductor 86 and an outer conductor 88 is attached to the outside of the compartment 20 by fastening the connector 84 onto a support member 87 which is in turn screwed to the outside of the sidewall 30 of the cross-arm section 22.

Means are provided for mounting a nonlinear device within the compartment 20 in the space formed by the iris 62. Such manner of mounting permits the variable reactance device to be coupled to the cavity resonators 50 and 52, as well as the cavity resonator 60, in order to function as the active element in the converter compartment 20. To accomplish this mounting, the top 34 of the cross-arm section 22 has an opening cut therethrough and an annular crown-like conductive support 89 is mounted therein by soldering to the top 34 of the cross-arm section 22. As shown more clearly in FIGURE 2, the crown-like support 89 is mounted in the iris 62 between the cavity resonators 50 and 52.

A nonlinear device, such as a variable capacitance diode 90, which may have a construction such as that shown in FIGURE 1 is mounted in the crown support 89. The casing of the diode 90 includes a metal cap 92, which makes electrical contact with one electrode, such as the anode, thereof. A metal base 94, having a cartridge like protrusion 96, makes electrical contact with the other electrode, the cathode, of the diode 90. The central portion 98 of the casing of the diode 90 is made of an insulating material. As illustrated in FIGURE 1, the diode 90 is inserted into the annular crown support 89 such that the cartridge 96 end of the diode 90 extends downwardly into the chassis compartment 20.

An opening 99 is provided in the bottom of the compartment 20 opposite the annular crown support 89, for mounting means to support the diode 90 at the base cartridge 96 end thereof. The support means comprises a conductive holder 100, including a disc 102 on which is fastened an upright slotted sleeve 104. An annular element 106, made of an insulating material such as Teflon, is fitted around the sleeve 104. A radial transmission line 107 comprising a first annular metallic conductor 108, an annular member 110 made of an insulating material such as Teflon, and a second annular metallic conductor 112, is provided to filter microwave energy and also to mount the conductive holder 100 on the outside bottom of the compartment 20. The annular metallic conductor 112 is recessed to provide a circumferential lip 113 and the insulating member 110 is inserted into the recess formed in the conductor 112 so that they are flush mounted with respect to each other. The conductor 108 is coaxially aligned to cover the insulator 110 and is soldered to the lip 113 of the conductor 112. The transmission line 107 is fitted around the sleeve 104 of the conductive holder 100 and is separated from the disc 102 by the insulating member 106. The conductor 106 is tapped and threaded to receive a pair of nylon screws 114 which fasten the conductive holder 100 and insulating member 106 thereto. The entire unit is mounted on the outside of the bottom 36 of the compartment 20 such as by soldering the conductor 108 to the bottom 36 so that the sleeve 104 extends through the opening 99.

Figure 3:
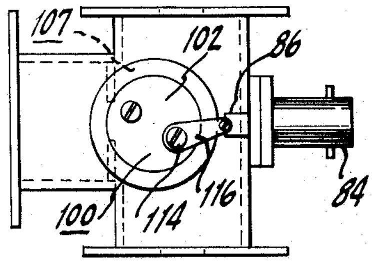
FIGURE 3 is a bottom view of the parametric frequency converter of FIGURE 1.

As shown in FIGURE 3, the conductive holder 100 and the radial transmission line 107 completely covers the opening 99 at the bottom 36 of the compartment 20. The disc 102 of the conductive holder 100 functions as one plate of a capacitor, the other plate of which is the conductor 112 of the transmission line 110 which makes electrical contact with the compartment 20. Also shown in FIGURE 3 is the manner of coupling the coaxial connector 84 to the disc 102, and consequently to the base of the diode 90. One end of a soldering lug 116 is conductively connected to the disc 102 by means of the screw 114 while the other end of the soldering lug 116 is soldered to the inner conductor 86 of the connector 84. It is to be noted that these connections are completely on the outside of the compartment 20.

Figure 2:
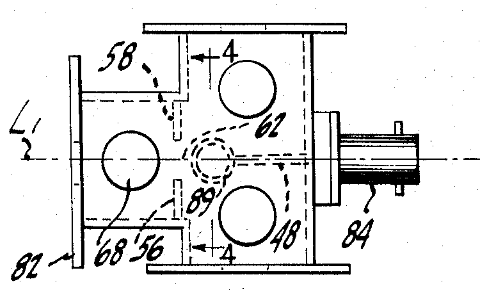
FIGURE 2 is a top view of the parametric frequency converter of FIGURE 1.
Figure 4:
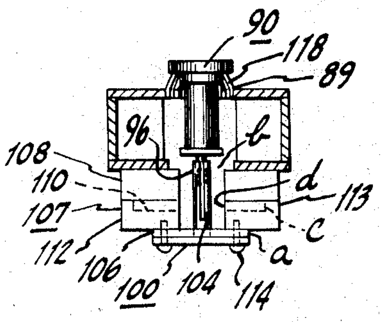
FIGURE 4 is a sectional view of the frequency converter of FIGURE 1 taken along the lines 4—4 in FIGURE 2.

To more clearly illustrate the mounting of the diode 90, reference is now made to FIGURE 4 which is a sectional view of the compartment 20 taken along the section lines 4—4 in FIGURE 2. In FIGURE 4, the tuning means 68 and the flange 82 have been removed for greater clarity. The diode 90 is inserted through the annular crown support 89 so that the diode 90 is supported on a plurality of fingers 118 mounted on the support 89. The fingers 118 may be bent inwardly to firmly support the diode 90 as well as make good electrical contact therewith. This also prevents any leakage of electromagnetic energy through the opening in the top of the compartment 20. Diodes with other types of casings than the one illustrated may be utilized. The cartridge-like protrusion 96 of the diode 90 is inserted into the sleeve 104 of the holder 100 and the slots in the sleeve 104 permit deformation of the sleeve 104 to make good electrical contact with the protrusion 96 of the diode 90. The protrusion 96, and thus the cathode electrode of the diode 90, is insulated from the bottom 46 of the compartment 20 at frequencies at which the insulating element 106 exhibits a high capacitive reactance. The functioning of the microwave filter 107 will be described in detail subsequently.

Referring back to FIGURE 1, the cross-arm section 22 of the compartment 20 is dimensioned to operate in the $TE_{10}$, or dominant, mode in which the electric flux lines extend from the bottom 36 to the top 34 of the cross-arm section 22 and are parallel to the end and sidewalls thereof. The magnetic flux lines form closed loops which are parallel to the top 34 and bottom 36 of the section 22. The conductive partition 48 is mounted in the cross-arm section 22 parallel to, and at a distance from the endwalls 26 and 28 such that the two half wave cavity resonators 50 and 52 are formed and resonate at different frequencies. In such cavity resonators, the electric field is greatest at the center where the tuning means 64, and 66 are mounted and diminishes near the side and endwalls thereof. The magnetic field however is a minimum in the vicinity of the tuning means while increasing to a maximum at the walls of these resonators. The tuning means 64 and 66 function as capacitive posts to alter the electric field within and thereby tune the cavity resonators 50 and 52.

The conductive members 56 and 58 transform the leg section 24 into the third cavity resonator 60, which is also dimensioned to operate in the $TE_{101}$ mode, and the tuning means 68 permits changing of the resonant frequency of this resonator. The iris 62 functions as an inductive window to provide coupling between the diode 90 and the cavity resonators 50, 52, and 60.

In operating the compartment 20 as a sum mode parametric up-converter with controlled regeneration, the cavity resonator 50 is selected to be a frequency selective filter for a pump oscillator (not shown) and is tuned to the frequency $f_p$ of a pump oscillator signal, which is applied to the resonator 50 through the aperture or iris 76. The cavity resonator 52 is selected to be the sum mode idler signal resonant circuit and is tuned to a frequency $f_o$ which is equal to the sum of the pump oscillator signal frequency $f_p$ and an input signal frequency of $f_s$. Output signals at the frequency $f_o$ are coupled from the resonator 52, through the iris 80 on the endwall thereof, to an output circuit for further processing. The cavity resonator 60 is selected to be the difference mode idler signal resonant circuit and is dimensioned to be resonant at a frequency $f_i$ equal to difference between the pump oscillator signal frequency $f_p$ and the input signal frequency $f_s$. Since no output signals are derived at the difference mode frequency $f_i$, no output iris is needed for the resonator 60.

The spacing between the conductive members 56 and 58 as well as the spacing between the partition wall 48 and the junction of the leg 24 and cross-arm 22 sections are each made to be less than a quarter of a wavelength at the frequency $f_p$ so as to minimize the coupling between the three cavity resonators 50, 52 and 60.

Cavity resonators such as 50, 52 and 60 are particularly suitable for use in parametric converters due to the high frequencies at which parametric converters are operated. At these high frequencies, the cavity resonators are compact and inexpensive and thus readily adaptable for inclusion in signal wave receivers. The cavity resonators 50, 52 and 60 exhibit relatively high loaded Q's (quality factors) which, in conjunction with the relatively low coefficient of coupling provided by the iris 62, minimizes interaction between the signals in the various cavity resonators and isolates from each other the circuits coupled to these resonators. Thus the pump oscillator and the difference mode idler cavity resonators 50 and 60 can be tuned without detuning the sum mode idler cavity resonator 52. Furthermore, even though presently available variable capacitance diodes such as the diode 90 exhibit a low Q at the cavity resonant frequencies, and would drastically reduce the Q of any cavity resonator if mounted centrally therein, the manner of mounting the diode 90 obviates this difficulty. The diode 90 does not severely reduce the Q's of the cavity resonators, since the diode 90 is mounted at the end of each cavity resonator in a position where the electric fields therein are a minimum, and hence is loosely coupled to all three cavity resonators. The diode 90 is therefore properly coupled to the resonators 50, 52 and 60. However, the diode 90, by being mounted at the junction of the cavity resonators 50 and 52 is more closely coupled to the cavity resonators 50 and 52 than the cavity resonator 60. Consequently the sum mode idler cavity resonator 52 exhibits a broader bandwidth than the difference mode idler cavity resonator 60. The sum mode idler cavity resonator 52 exhibited a bandwidth on the order of 20 megacycles at a resonant frequency on the order of 10,000 megacycles. The bandwidth of 20 megacycles was selected to obviate problems due to drift of the pump oscillator. The bandwidth of any of the cavity resonators 50, 52 and 60 can be broadened by closer coupling of the diode 90 to the particular cavity.

Figure 5:
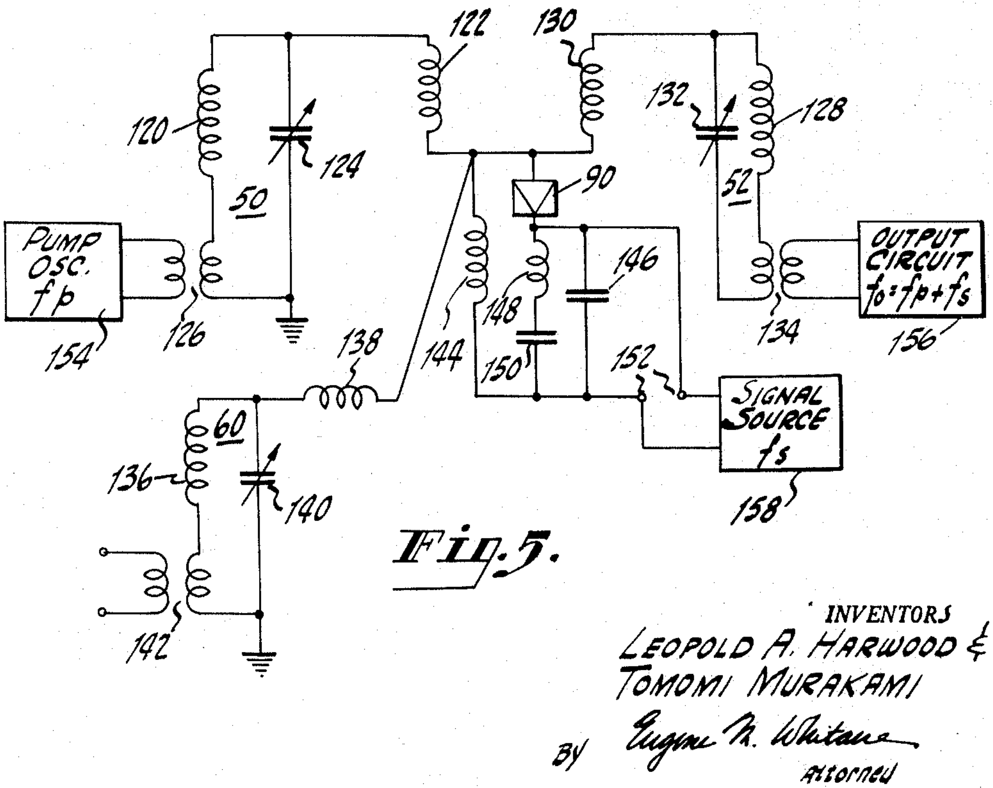
FIGURE 5 is an approximate equivalent schematic circuit diagram of the parametric converter of FIGURE 1.

An approximate equivalent schematic circuit diagram of the parametric converter of FIGURE 1 is illustrated in FIGURE 5. A cavity resonator may be considered to be equivalent to a resonant tank circuit which includes a pair of inductors and a capacitor all connected in parallel with each other. The forming of an inductive iris in the wall of a cavity resonator effectively adds a transformer coupling to the tank circuit. Thus, in FIGURE 5 the inductors 120 and 122 and the capacitor 124 comprise the cavity resonator 50 while the transformer 126 represents the iris for this cavity. The inductors 128 and 130 and the capacitor 132 represent the cavity resonator 52, and the transformer 134 represents the iris for this cavity. Similarly, the inductors 136 and 138 and the capacitor 140 represent the cavity resonator 60 while the transformer 142 represents an iris coupling for this cavity. The inductor 144 represents the iris 62. The diode 90 is connected in series with a capaictor 146 across the inductor 144. The capacitor 146 is the schematic representation of the capacitance exhibited between the disc 102 and the annular conductor 112 which are separated by the insulating element 106. The series combination of an inductor 148 and capacitor 150 are shunted across the capacitor 146 and represents the radial transmission line 107, in series resonance at the frequency of the difference mode idler signal $f_i$, and therefore substantially a short circuit at this frequency. A pair of terminals 152 represents the coaxial connector 84. The capacitors 124 and 132 and 140 are shown variable and represent the tuning means 64, 66 and 68 respectively in the compartment 20.

A pump oscillator 154 is coupled to the cavity resonator 50 which functions as a frequency selective filter for the oscillator 154. The oscillator 154 may comprise any suitable high frequency oscillator such as klystron or tunnel diode oscillator. An output circuit 156 is coupled to the sum mode idler signal cavity resonator 52 for further processing of sum mode idler output signals. A signal source 158, which may for example comprise an antenna for the reception of ultra high frequency signals, is coupled across the capacitor 146 at the terminals 152. Capacitor 146 and hence the composition and thickness of the insulating element 106 is selected to exhibit a high capacitive reactance at the frequency $f_s$ of an input UHF signal to develop an appreciable signal amplitude for application to the diode 90. Since the cavity resonators 50, 52 and 60 exhibit substantially a short circuit to input signals at the frequency $f_s$, the signal source 158 is effectively decoupled from these resonators. Oscillations at the frequency $f_p$ are coupled to the resonator 50 from the pump oscillator 154. Hence, the cavity resonator 50 is tuned to the frequency $f_p$ of the pump oscillator 154 by means of the tuning capacitor 124 and this frequency is selected to be substantially higher than the frequency $f_s$ of the input signal. The sum mode idler signal cavity resonator 52 is fixedly tuned to the output signal frequency $f_o$ which is substantially equal to the sum of the pump oscillator and input signal frequencies $f_p$ and $f_s$.

Input signals from the signal source 158 and pump oscillator signals from the pump oscillator 154 are applied to the diode 90. The mixing of the input signal at the frequency $f_s$ and the pump oscillator signal at the frequency $f_p$ in the time varying capacitance of the diode 90 produces mixed signals at the frequencies $f_o$ and $f_i$ corresponding respectively to the sum and difference of the frequencies $f_p$ and $f_s$. Since the parametric converter is operated as a sum mode parametric up-converter, idler output signals at the frequency $f_o$ are coupled from the sum mode idler signal resonant circuit 52 and applied to the output circuit 156 for down-conversion to a desired intermediate frequency and processed further to derive the modulation contained therein. Also since no difference mode idler output signals are derived from the difference mode idler signal resonant circuit 60 the transformer 142 can be shorted (no iris formed in this cavity resonator).

Although no output signals at the difference mode frequency $f_i$ are derived from the cavity resonator 60, the fact that idler signals at this frequency are permitted to develop in this cavity resonator enhances the conversion gain exhibited by the parametric converter. When a difference mode idler signal is developed, the diode 90 exhibits an effective negative resistance and regeneration occurs. The sum mode idler output signal at the frequency $f_o$ is amplified and the conversion gain is increased. The conversion gain exhibited by the regenerative parametric converter is a function of the magnitude of the effective negative resistance. The magnitude of the effective negative resistance exhibited by the diode 90 is in turn a function of the amplitude of the difference mode idler signal which is permitted to develop in the cavity resonator 60. When the cavity resonator 60 is tuned by the tuning capacitor 140 (tuning means 68) to a frequency near the difference mode signal frequency $f_i$, a relatively large amplitude difference mode idler signal is developed in the resonator 60 and a large negative resistance is exhibited by the diode 90. Such operation causes the parametric converter to exhibit a large conversion gain but the stability of the converter suffers. If the input impedance of the signal source 158 varies, spurious oscillations may readily occur. When the cavity resonator 60 is detuned sufficiently from the difference mode idler signal frequency $f_i$ so that the frequency $f_i$ does not fall within the bandpass of the resonator 60, the conversion gain exhibited is a function of the ratio of the frequency $f_o$ to the frequency $f_s$. Thus by varying the capacitor 140 (tuning means 68), the gain can be selectively increased from that exhibited by pure sum mode operation to exceedingly high gains when operated near the point of instability. The actual setting of the capacitor 140 would depend on individual design considerations.

It is important that difference mode idler signals be developed only in the cavity resonator 60 so that the amount of regeneration permitted can be selectively controlled. The cavity resonators 50 and 52 which are tuned respectively to the frequencies $f_p$ and $f_o$, do not develop a significant amount of difference mode idler signals at the frequency $f_i$. It is also important that the tuning of the resonator 60 does not affect or detune the tuning of the cavity resonators, 50 and 52. The cavity resonators 50 and 52 are effectively isolated from the resonator 60 so no detuning occurs. Both of the above are accomplished because the resonators 50 and 52, as stated previously, exhibit high loaded Q's and are only loosely coupled to the resonator 60.

Difference mode idler signals could however be developed across the capacitor 146, because although the capacitive reactance exhibited at the frequency $f_i$ is small, it is significant enough to prevent the cavity resonator 60 from being the sole means of controlling the regeneration exhibited by the parametric converter. The microwave filter 107 (reactances 148 and 150) substantially prevents difference mode idler signals from developing across the capacitor 146 as well as sum mode idler signals and pump oscillator signals. To explain the operation of the microwave filter 107, reference is made back to FIGURE 4.

The conductive holder 100 in conjunction with the other elements mounting the protrusion 96 of the diode 90 functions as a transmission line at microwave frequencies. The end of the transmission line is at the point "*a*" and the beginning is the point "*b*." To prevent microwave signals, and particularly difference mode idler signals, from being transmitted down the transmission line, the sending end "*b*" of this effective transmission line should exhibit a short circuit at the frequency $f_i$. This is accomplished by including the microwave filter 107. The filter 107 functions as a radial transmission line with the end "*c*" of the line being short circuited by the lip 113 of the conductor 112. The elements 108 and 112 are the parallel conductors of the radial transmission line with the element 110 being the insulator therefor. The distance from the lip 113 or end "*c*" of the radial line 107 to the central opening thereof at the point "*d*" is made a quarter of a wavelength at the difference mode idler signals frequency $f_i$ and consequently the short circuit at the end "*c*" is transformed to an open circuit at the end "*d*" by the quarter wave transformation. Similarly the distance from the point "d" to the point "b" is also made a quarter of a wavelength at the frequency $f_i$ to transform the open circuit at the point "d" to a short circuit at the end "b." Of course, the physical distances from "c" to "d" and from "d" to "b" will not be equal because the dielectric and consequently the characteristic impedance of the line changes from Teflon to air in traversing the entire distance from "c" to "b." As a further safeguard, the distance from the open end "a" of the effective transmission line to the point "b" is also made to reflect a short circuit across the end "b."

Thus the effective short circuit appearing at the end "b" prevents difference mode idler signals from developing across the capacitance exhibited between the disc 102 and conductor 112. Similarly microwave signals at the frequencies $f_o$ and $f_p$ are also substantially suppressed and the signals flowing in the cavity resonators 50 and 52 are effectively isolated from the input terminals and signal source. Thus the cavity resonator 60 is substantially the sole means of controlling the regeneration of a parametric converter in accordance with the invention and the amount of regeneration can be selectively controlled by tuning the cavity resonator 60.

While the converter structure of FIGURE 1 has been described as a parametric converter, it is apparent that this structure could also be readily utilized as a mixer.

Thus in accordance with the invention a frequency converter is provided which is compact and simple in construction and which exhibits substantial isolation between the various resonant circuits thereof. The amount of conversion gain exhibited by the output signal can be simply controlled by means of a tuning capacitor.

What is claimed is:

1. A high frequency structure comprising in combination:

a T-shaped chassis compartment made of a conductive material and comprised of a cross-arm section and a leg section;

a first conductive partition mounted within said cross-arm section to separate said cross-arm section into a first cavity resonator and a second cavity resonator;

a second conductive partition mounted at the junction of said cross-arm and leg sections to transform said leg section into a third cavity resonator;

said first and second conductive partitions defining an iris between said first, second and third cavity resonators adjacent the junction of said cross-arm and leg sections; and means for mounting a nonlinear device within said compartment in the space formed by said iris.

2. A high frequency mixer structure comprising in combination:

a T-shaped chassis compartment made of a conductive material and comprised of a cross-arm section and a leg section;

said leg section positioned intermediate the ends of said cross-arm section and having a center line lying in the same plane and substantially perpendicular to the center line of said cross-arm section;

a first conductive partition mounted within said cross-arm section substantially parallel to the ends thereof to separate said cross-arm section into a first cavity resonator, resonant at a first microwave frequency and a second cavity resonator, resonant at a second microwave frequency;

a second conductive partition mounted at the junction of said cross-arm and leg sections to transform said leg section into a third cavity resonator, resonant at a third frequency equal to one of the beat frequencies of said first and second frequencies;

said first and second partitions defining an iris adjacent the junction of said leg and cross-arm sections;

a nonlinear device;

means for mounting said device within said compartment in the space formed by said iris;

means for applying to said first and second cavity resonators signals of said first and second frequencies respectively; and means for deriving from said third cavity resonator a mixed output signal produced by the interaction of said applied signals in said nonlinear device.

3. A parametric converter comprising in combination:

a T-shaped chassis compartment made of a conductive material and having a cross-arm section and a leg section;

said leg section positioned intermediate the ends of said cross-arm section and having a center line lying in the same plane and substantially perpendicular to the center line of said cross-arm section;

a first conductive partition mounted within said cross-arm section parallel to the ends thereof to separate said cross-arm section into a first cavity resonator, resonant at the frequency $f_p$ of a pump oscillator signal, and a second cavity resonator, resonant at the frequency $f_o$ of a sum mode idler signal;

a second conductive partition mounted at the junction of said leg and cross-arm sections to transform said leg section into a third cavity resonator, resonant at the frequency $f_i$ of a difference mode idler signal;

said first and second partitions defining an iris adjacent the junction of said leg and cross-arm sections;

a nonlinear device;

means for mounting said device within said compartment in the space formed by said iris; and means adapting said mounting means to apply to said nonlinear device an input signal of a frequency $f_s$ much lower than the frequency of said pump oscillator and idler signals.

4. A parametric frequency converter comprising in combination:

a T-shaped chassis compartment made of a conductive material and comprised of a cross-arm section and a leg section;

said leg section positioned intermediate the ends of said cross-arm section and having a center line lying in the same plane and substantially perpendicular to the center line of said cross-arm section;

a first conductive partition mounted within said cross-arm section parallel to the ends thereof to separate said cross-arm section into a first cavity resonator, resonant at the frequency $f_p$ of a pump oscillator signal, and a second cavity resonator, resonant at the frequency $f_o$ of a sum mode idler signal;

a second conductive partition mounted at the junction of said cross-arm and leg sections to transform said leg section into a third cavity resonator, resonant at the frequency $f_i$ of a difference mode idler signal;

said first and second partitions defining an iris adjacent the junction of said cross-arm and leg sections;

a nonlinear variable capacitance diode;

means for mounting said diode within said compartment in the space formed by said iris to be coupled to said first, second and third cavity resonators;

means for coupling pump oscillatory signals of the frequency $f_p$ into said first cavity resonator;

means for applying input signals of a frequency $f_s$ much lower than the frequencies of said pump oscillator and idler signals to said diode;

means for deriving from said second cavity resonator sum mode idler signals produced by the interaction of said pump oscillator and input signals in the nonlinear capacitance of said diode and having a frequency $f_o$ substantially equal to the sum of the frequencies of said pump oscillator and input signals; and means for varying the resonant frequency of said third cavity resonator from the difference mode idler signal frequency $f_i$ to vary the amplitude of said sum mode idler signals.

5. A parametric frequency converter comprising in combination:

a chassis compartment made of conductive material;

a conductive partition mounted within said compartment to separate said compartment into a first cavity resonator, resonant at the frequency $f_p$ of an applied pump oscillator signals; and a second cavity resonator, resonant at the frequency $f_o$ of an input idler signal;

said conductive partition mounted so as to define an iris between said first and second cavity resonators;

a conductive disc having an upright sleeve;

an annular insulating member inserted through said sleeve;

means for mounting said disc and said insulating member to cover an opening in said compartment to the bottom of said iris such that said sleeve extends into said compartment;

a nonlinear capacitance diode having a pair of electrodes;

means for mounting said diode in said iris so that one of said electrodes makes electrical contact with the top of said compartment and the other of said electrodes makes electrical contact with the sleeve of said conductive disc;

said conductive disc and said compartment exhibiting therebetween a substantial capacitive reactance at the frequency $f_s$ of an applied input signal;

a microwave filter, exhibiting a short circuit at the frequency $f_i$ substantially equal to the difference between the frequencies $f_p$ and $f_s$, shunted across the said capacitance which is exhibited between said conductive disc and said compartment; and means for coupling from said second cavity resonator output idler signals at the frequency $f_o$ substantially equal to the sum of the frequencies $f_p$ and $f_s$ produced by the interaction of said input and pump oscillator signals in the nonlinear capacitance of said diode.

6. A parametric frequency converter comprising in combination:

a chassis compartment made of conductive material;

a conductive partition mounted within said compartment to separate said compartment into a first cavity resonator, resonant at the frequency $f_p$ of an applied pump oscillator signal, and a second cavity resonator, resonant at the frequency $f_o$ of an output idler signal;

said conductive partition mounted so as to define an iris between said first and second cavity resonators;

a radial transmission line comprising;

a first annular conductor, a second annular conductor having a recess therein to provide a raised circumferential lip thereon, and an insulating element mounted in said recess, means for fastening together said first and second conductors to cause said lip to make electrical contact with said first conductor to provide a shorted end radial transmission line;

a conductive disc having an upright sleeve;

an annular insulating member inserted through said sleeve;

means for mounting said radial transmission line through said sleeve;

means for mounting the combination of said radial transmission line, said disc and said insulating member, to cover an opening in said compartment at the bottom of said iris such that said sleeve extends into said compartment;

a nonlinear capacitance diode having a pair of electrodes;

means for mounting said diode in said iris so that one of said electrodes makes electrical contact with the top of said compartment and the other of said electrodes makes electrical contact with the sleeve of said conductive disc;

said conductive disc and said first conductor exhibiting therebetween a substantial capacitive reactance at a frequency $f_s$ of an input signal applied thereacross;

said radial transmission line dimensioned to exhibit a substantial short circuit across the opening in said compartment at the frequency $f_i$ substantially equal to the difference between the frequencies $f_p$ and $f_s$; and means for coupling from said second cavity resonator output idler signals at the frequency $f_o$ substantially equal to the sum of the frequencies $f_p$ and $f_s$ produced by the interaction of said input and pump oscillator signals in the nonlinear capacitance of said diode.

References Cited by the Examiner

UNITED STATES PATENTS

| | | | |
|---|---|---|---|
| 2,408,420 | 10/1946 | Ginzton | 321—69 |
| 2,460,109 | 1/1949 | Southworth | 321—69 |
| 2,970,275 | 1/1961 | Kurzrok | 330—4.9 |

OTHER REFERENCES

"Parametric Phase Distortionless L-band Limiter" by A. D. Sutherland and D. E. Countiss, published by Proceedings of the IRE—Correspondence (May 1960), pp. 938 and 939.

ROY LAKE, *Primary Examiner.*

LLOYD M. McCOLLUM, *Examiner.*

G. J. BUDOCK, D. N. HOSTETTER, *Assistant Examiners.*